(12) United States Patent
Cho et al.

(10) Patent No.: US 7,738,293 B2
(45) Date of Patent: Jun. 15, 2010

(54) APPARATUS AND METHOD OF MEMORY PROGRAMMING

(75) Inventors: Kyoung Lae Cho, Yongin-si (KR); Yoon Dong Park, Gyeonggi-do (KR); Jun Jin Kong, Yongin-si (KR); Jong Han Kim, Suwon-si (KR); Jae Hong Kim, Seoul (KR); Young Hwan Lee, Suwon-si (KR); Heeseok Eun, Yongin-si (KR); Seung-Hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 163 days.

(21) Appl. No.: 12/213,944

(22) Filed: Jun. 26, 2008

(65) Prior Publication Data

US 2009/0185417 A1      Jul. 23, 2009

(30) Foreign Application Priority Data

Jan. 22, 2008   (KR) ............... 10-2008-0006501

(51) Int. Cl.
G11C 16/04      (2006.01)
G11C 29/04      (2006.01)

(52) U.S. Cl. ........... 365/185.03; 365/201; 365/200; 365/185.2; 365/185.09; 714/809

(58) Field of Classification Search ............ 365/185.09, 365/185.2, 185.03, 200, 201; 714/809, 819, 714/824
See application file for complete search history.

(56) References Cited

U.S. PATENT DOCUMENTS 6,111,787 A *    8/2000   Akaogi et al. .......... 365/185.11
6,275,961 B1     8/2001   Roohparvar
6,700,809 B1     3/2004   Ng et al.
2002/0126554 A1  9/2002   Choi et al.
2004/0136236 A1* 7/2004   Cohen .................... 365/185.2
2004/0225947 A1  11/2004  Guterman et al.
2008/0002464 A1* 1/2008   Maayan ................... 365/185.2

FOREIGN PATENT DOCUMENTS

| JP | 2000-020409 | 1/2000 |
| KR | 1020050011409 | 1/2005 |
| KR | 1020060007629 | 1/2006 |

OTHER PUBLICATIONS

International Search Report dated Dec. 22, 2008.

* cited by examiner

*Primary Examiner*—Hoai V Ho
*Assistant Examiner*—Jay Radke
(74) *Attorney, Agent, or Firm*—Harness, Dickey & Pierce, P.L.C.

(57) ABSTRACT

A memory programming apparatuses and/or methods are provided. The memory programming apparatus may include a data storage unit, a first counting unit, an index storage unit and/or a programming unit. The data storage unit may be configured to store a data page. The first counting unit may be configured to generate index information by counting a number of cells included in at least one reference threshold voltage state based on the data page. The index storage unit may be configured to store the generated index information. The programming unit may be configured to store the data page in the data storage unit and store the generated index information in the index storage unit. The first counting unit may send the generated index information to the programming unit. The memory programming apparatus can monitor distribution states of threshold voltages in memory cells.

18 Claims, 10 Drawing Sheets

APPARATUS AND METHOD OF MEMORY PROGRAMMING

PRIORITY STATEMENT

This application claims priority from Korean Patent Application No. 10-2008-0006501, filed on Jan. 22, 2008, in the Korean Intellectual Property Office, the entire disclosure of which is incorporated herein by reference.

BACKGROUND

1. Field

Example embodiments relate to apparatuses and/or methods that may program data in memory devices. Also, example embodiments relate to multi-level (multi-bit) programming apparatuses and/or methods that may program data in multi-level cell (MLC) memory devices.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. The programmed threshold voltage may have a distribution range due to a fine electrical characteristic difference between the SLC memories. For example, when a voltage level read from the memory cell is greater than 0.5V and less than 1.5V, it may be determined that the data stored in the memory cell has a logic value of "1." When the voltage level read from the memory cell is greater than 2.5V and less than 3.5V, it may be determined that the data stored in the memory cell has a logic value of "0." The data stored in the memory cell may be classified depending on the difference between cell currents and/or cell voltages during the reading operations.

Meanwhile, a multi-level cell (MLC) memory device that may store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and read-failure rates may increase. To store 'm' bits in a single memory cell, $2^m$ voltage level distributions may be required, where m may be real number. However, since the voltage window for a memory device is limited, the difference in threshold voltage between adjacent bits may decrease as 'm' increases, causing the read-failure rate to increase. For this reason, it may be difficult to improve storage density using the MLC memory device according to conventional art.

SUMMARY

Example embodiments may provide apparatuses and/or methods that may apply a new multi-level (multi-bit) programming scheme to a multi-level cell (MLC) memory and thereby reduce read-failure rate when reading data stored in a memory cell.

Example embodiments also may provide apparatuses and/or methods that may monitor changes of threshold voltage states generated in a memory cell. In this instance, example embodiments may directly monitor the changes of threshold voltage states generated in a data area and thereby provide a monitoring result with greater reliability.

Example embodiments also may provide apparatuses and/or methods that may reduce a necessary memory area when monitoring changes of threshold voltage states generated in the memory cell.

Example embodiments also may provide apparatuses and/or methods that may reduce a necessary memory area, in view of reducing or minimizing errors when reading data stored in a memory cell.

According to example embodiments, a multi-bit programming apparatus may include a data storage unit, a first counting unit, an index storage unit and/or a programming unit. The data storage unit may be configured to store a data page. The first counting unit may be configured to generate index information by counting a number of cells included in at least one reference threshold voltage state based on the data page. The index storage unit may be configured to store the generated index information. The programming unit may be configured to store the data page in the data storage unit and store the generated index information in the index storage unit. The first counting unit may send the generated index information to the programming unit.

According to another example embodiments, a multi-bit programming method may include generating index information by counting a number of cells included in each of at least one reference threshold voltage states based on a data page, storing the data page and/or storing the generated index information.

BRIEF DESCRIPTION

The above and/or other aspects, and advantages will become more apparent and more readily appreciated from the following detailed description of example embodiments, taken in conjunction with the accompanying drawings, in which.

DETAILED DESCRIPTION

Figure 1:
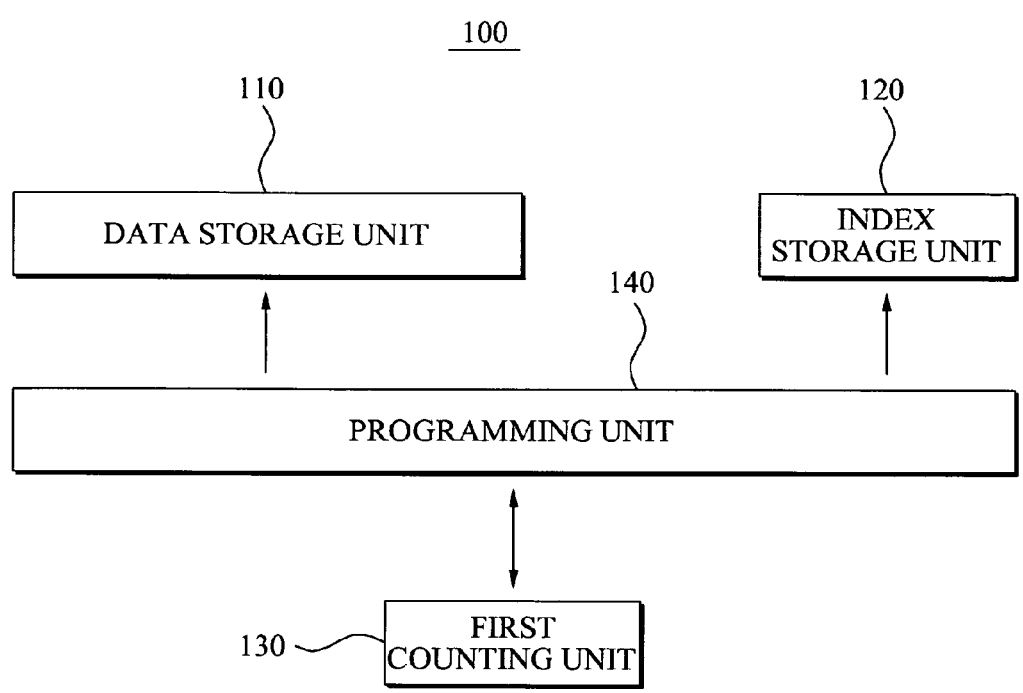
FIG. 1 is a diagram illustrating a memory programming apparatus according to example embodiments.

Example embodiments will be more clearly understood from the detailed description taken in conjunction with the accompanying drawings. Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures. In the drawings, the thicknesses of layers and regions may be exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms.

A memory cell adopting a memory programming method of example embodiments may be divided into a data field and an index field.

Data may be stored in the data field. In the index field, information that may be stored that shows threshold voltage states of memory cells in the data field when the memory cells of the data field are programmed.

Generally, programming with respect to a non-volatile memory may be performed by modifying threshold voltages of the memory cells. The threshold voltages of the memory cell may indicate data stored in the memory cells. The threshold voltages of the memory cells may have distribution ranges for each state.

After data is stored in the non-volatile memory, the threshold voltage of the programmed memory cells may be changed due to mechanisms, such as a floating gate losing its charge.

Example embodiments provide memory programming apparatuses and/or methods that may monitor threshold voltage changes of memory cells and may reduce or minimize area overhead when verifying whether an error occurs in data stored in the memory cells.

FIG. 1 is a diagram illustrating a memory programming apparatus 100 according to example embodiments.

Referring to FIG. 1, the memory programming apparatus 100 includes a data storage unit 110, an index storage unit 120, a first counting unit 130, and a programming unit 140.

The data storage unit 110 may correspond to the aforementioned data field, and a data page may be stored in the data storage unit 110.

The data storage unit 110 may program data to a data page, and, depending on example embodiments, the data page may denote a stored data set in which memory cells connected to a single word line are simultaneously programmed.

The first counting unit 130 may generate index information by counting a number of at least one reference threshold voltage state based on the data page.

The generated index information may be stored in the index storage unit 120.

The programming unit 140 may store the data page in the data storage unit 110, and store the index information in the index storage unit 120.

The data storage unit 110 and the index storage unit 120 may include a plurality of multi-bit cells. A multi-bit cell may store multi-bit data.

The operation of storing data in the multi-bit cell may change a threshold voltage of the multi-bit cell. If a multi-bit cell stores up to N-bit data, where N may be a real number, a number of threshold voltage levels which may be generated in the multi-bit cell may be $2^N$.

Since it may take a longer amount of time to store (or program) data than to read data, the memory programming apparatus 100 may reduce a programming time with respect to entire multi-bit cells by simultaneously programming a plurality of multi-bit cells, which are physically adjacent to each other. In this instance, a set of the multi-bit cells, which may be simultaneously programmed, may be referred to as a page, and a single page may be a set of multi-bit cells connected to a single word line.

For convenience, it may be assumed that a single page covers the data storage unit 110 and the index storage unit 120. From among areas of the single page, an area being included in the data storage unit 110 may be referred to as a main page, and, from among the other areas of the single page, the area being included in the index storage unit 120 may be referred to as a sub-page.

However, while the main page and sub-page may be referred to as such for convenience, the scope of claims of example embodiments should not be construed as being limited by the use of the terms main page and sub-page.

If the main page consists of multi-bit cells that may store up to N-bit data, the main page may store up to an N number of data pages.

The programming unit 140 may perform an N number of page programming operations to store an N number of data pages in the main page. Each of the page programming operations may be an operation that stores a data page in the main page.

A multi-bit cell may have any one of $2^N$ threshold voltage levels after the N number of page programming operations. The single main page including a plurality of multi-bit cells may have $2^N$ threshold voltage levels after the N number of the page programming operations. Generally, since characteristics of each multi-bit cell are different from each other, threshold voltage levels of the multi-bit cells storing identical data may differ. Due to the differences of the threshold voltage levels of the multi-bit cell, the threshold voltage levels of the multi-bit cells within the single main page may generate $2^N$ distribution states.

Depending on example embodiments, the programming unit 140 may store multi-bit data in a multi-bit cell according to a single programming operation sequence, without performing programming for each data page. In this instance, the programming unit 140 may store the index information generated in the course of a performing operation sequence in the index storage unit 120.

According to example embodiments, the programming unit 140 may store index information in the index storage unit 120 during the course of storing the data page in the data storage unit 110.

According to example embodiments, the programming unit 140 may store the N number of data pages in the main page of the data storage unit 110 to be a first density, and store index information in the sub-page of the index storage unit 120 to be a second density. In this instance, the first density is N-bits, and the second density is a smaller value than the N-bits.

In this instance, the programming unit 140 may store the N number of data pages in the data storage unit 110 by performing the N number of page programming operations. The programming unit 140 may store the index information in the index storage unit 120 during the course of performing an Nth page programming operation, that is a last page programming operation. Through such a method, the programming unit 140 may reduce or minimize an effect that the storing operation of the index information may cause on the data storage unit 110.

Depending on example embodiments, the programming unit 140 may respectively store the data and the index information in the data storage unit 110 and the index storage unit 120 by performing a single programming operation sequence. In this instance, the index storage unit 120 may store the index information while the data is stored in the data storage unit 110. The programming unit 140 may reduce or minimize an effect that the storing operation of the index information may cause on the data storage unit 110 by storing the data and the index information simultaneously. In this instance, the storing operation of the index information may be performed similar to the last page programming operation above when the N number of the page programming is performed.

According to example embodiments, the programming unit 140 may sequentially store the index information in the index storage unit 120 during the course of performing each of the N number of page programming operations. Through such a method, the programming unit 140 may prevent threshold voltages of cells in the index storage unit 120 from rapidly changing and may reduce or minimize the changes of the threshold voltages of the cells in the data storage unit 110.

According to example embodiments, the programming unit 140 may store a data page and index information by adopting an identical programming mechanism with respect to the data storage unit 110 and the index storage unit 120. Otherwise, according to example embodiments, the programming unit 140 may store a data page in the data storage unit 110 by adopting a first programming mechanism with respect to the data storage unit 110, and may store index information in the index storage unit 120 by adopting a second programming mechanism with respect to the index storage unit 120.

The programming unit 140 may store the data page by adopting a first verification voltage with respect to the data storage unit 100, and may store the index information by adopting a second verification voltage with respect to the index storage unit 120.

According to example embodiments, the programming unit 140 may erase all data stored in the data storage unit 110 and the index storage unit 120 by applying an erase condition voltage level. More specifically, the programming unit 140 may detect cells which are not programmed from among the memory cells in the data storage unit 110 and the index storage unit 120 before erasing the data stored in the data storage unit 110 and the index storage unit 120.

The programming unit 140 may erase the data storage unit 110 and the index storage unit 120 after pre-programming the detected unprogrammed cells. The pre-programming operation may be an operation of programming the detected unprogrammed cells to be up to a specific threshold voltage.

Through the pre-programming operation, the memory programming apparatus 100 may equalize a number of program/erase (P/E) cycles for all memory cells in the data storage unit 110 and the index storage unit 120.

The number of P/E cycles may affect programming characteristics and charge retention characteristics of memory cells. The memory programming apparatus 100 may equalize the programming characteristics and the charge retention characteristics of the memory cells by equalizing the number of P/E cycles for the memory cells.

The memory programming apparatus 100 according to example embodiments may further include a reference selection unit (not shown) which selects at least one reference voltage state from among the $2^N$ threshold voltage states. The reference selection unit may select a reference threshold voltage state by referring to distribution states of threshold voltages formed in each memory cell by the data page. Alternatively, the programming unit 140 may also select the reference threshold voltage state by referring to distribution states of threshold voltages formed in each memory cell by the data page.

For example, the reference selection unit may divide the distribution states into a high threshold voltage area, an intermediate threshold voltage area, and a low threshold voltage area, and select a single reference threshold voltage state in each of the threshold voltage areas. When changes of threshold voltages in the high threshold voltage area are crucial, the reference selection unit may select a plurality of threshold voltage states in the high threshold voltage area.

The first counting unit 130 may generate the index information based on a number of each of the threshold voltage states being counted, in the N data pages. For example, when the first counting unit 130 generates the index information using the three reference threshold voltage states, the first counting unit 130 may generate first index information by counting a number of first reference threshold voltage states in the N data pages, may generate second index information by counting a number of second reference threshold voltage states in the N data pages, and may generate third index information by counting a number of third reference threshold voltage states in the N data pages.

The first counting unit 130 according to example embodiments may generate the first index information by summing up a number of threshold voltage states having threshold voltages equal to the first reference threshold voltage state and a number of threshold voltage states having threshold voltages higher than the first reference threshold voltage state. The first counting unit 130 may generate the second index information and the third index information in the similar method to generate the first index information.

Figure 2:
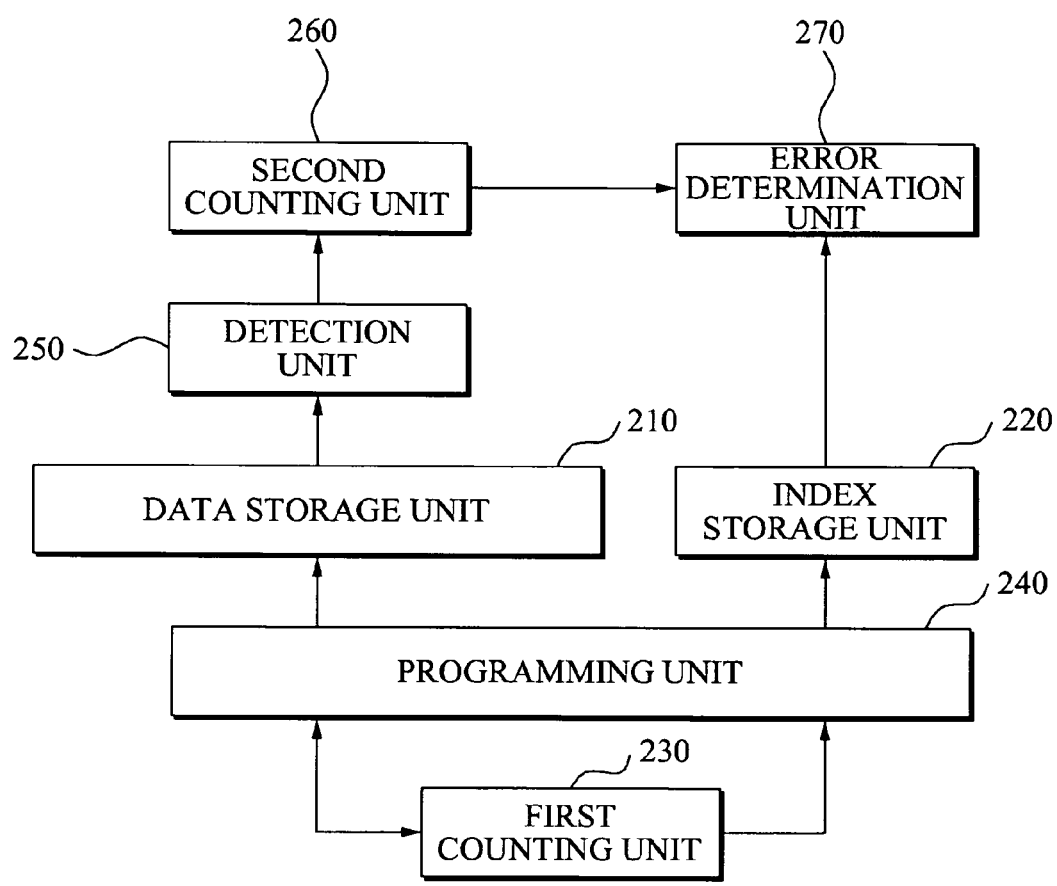
FIG. 2 is another diagram illustrating a memory programming apparatus according to example embodiments.

FIG. 2 is another diagram illustrating a memory programming apparatus 200 according to example embodiments.

Referring to FIG. 2, the memory programming apparatus 200 includes a data storage unit 210, an index storage unit 220, a first counting unit 230, and a programming unit 240, similar to the memory programming apparatus 100 of FIG. 1. The memory programming apparatus 200 further includes a detection unit 250, a second counting unit 260, and an error determination unit 270.

Data pages may be stored in the data storage unit 210. The first counting unit 230 may generate index information by counting a number of at least one reference threshold voltage state in the data pages.

The generated index information may be stored in the index storage unit 220. The programming unit 240 may store the data pages in the data storage unit 210, and store the index information in the index storage unit 220.

The detection unit 250 may read the data pages stored in the data storage unit 210. The second counting unit 260 may generate verification information by counting a number of the at least one reference threshold voltage state in the read data pages.

The error determination unit 270 may determine whether an error occurs on the read data pages based on the generated verification information and the index information stored in the index storage unit 220.

Figure 3:
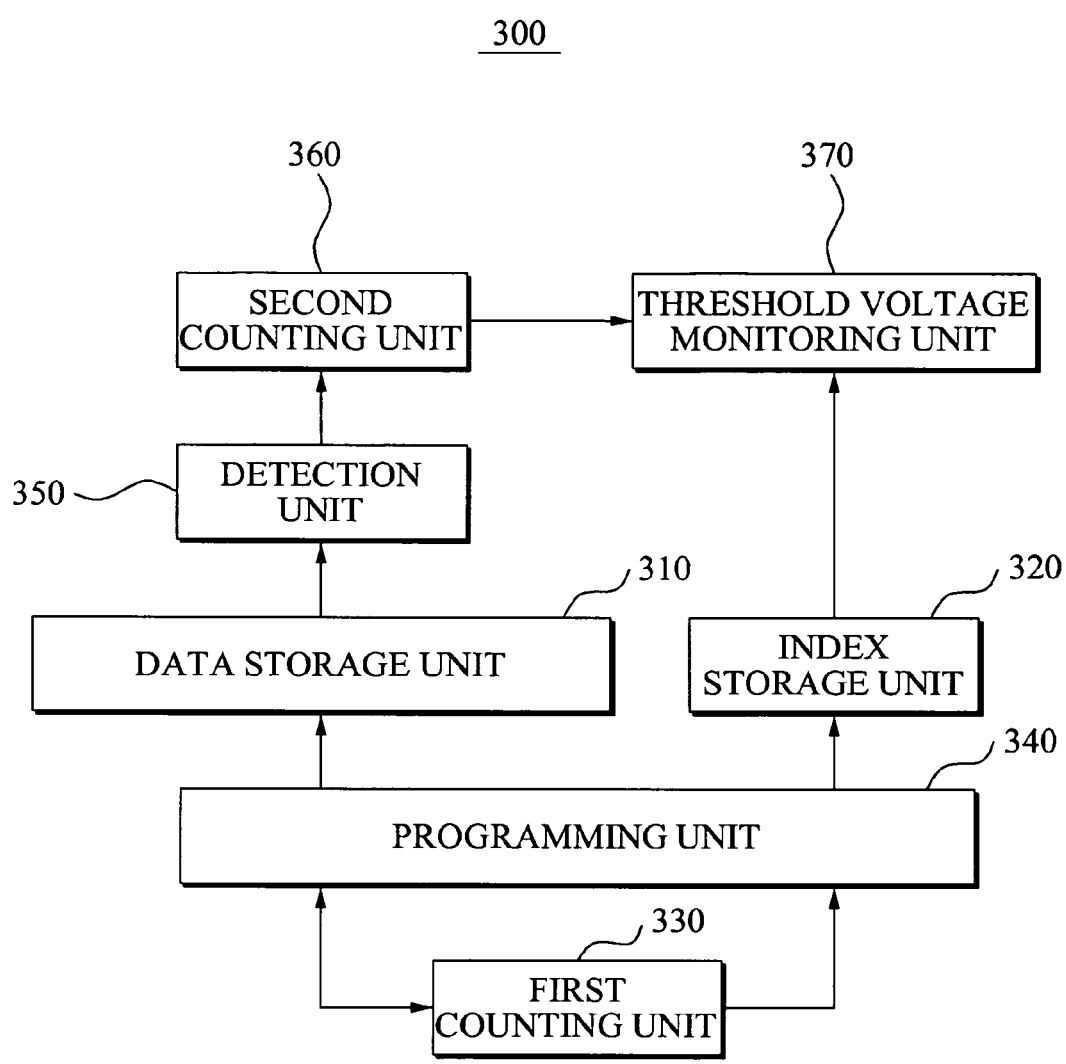
FIG. 3 is still another diagram illustrating a memory programming apparatus according to example embodiments.

FIG. 3 is still another diagram illustrating a memory programming apparatus 300 according to example embodiments.

Referring to FIG. 3, the memory programming apparatus 300 includes a data storage unit 310, an index storage unit 320, a first counting unit 330, and a programming unit 340, similar to the memory programming apparatus 100 of FIG. 1. The memory programming apparatus 300 further includes a detection unit 350, a second counting unit 360, and a threshold voltage monitoring unit 370.

The data storage unit 310 may store data pages. The first counting unit 330 may generate index information by counting a number of at least one reference threshold voltage state in the data pages based on a mapping relation of a data pattern and threshold voltage of the pages.

The index storage unit 320 may store the generated index information. The programming unit 340 may program the data pages in the data storage unit 310, and may program the index information in the index storage unit 320.

The detection unit 350 may read the data pages stored in the data storage unit 310. The second counting unit 360 may generate verification information by counting a number of the at least one reference threshold voltage states in the read data pages based on the mapping relation of data pattern and threshold voltage of the pages.

The threshold voltage monitoring unit 370 may monitor changes of distributions of threshold voltages of cells from among the data storage unit 310 based on the generated verification information and the index information stored in the index storage unit 320.

Figure 4:
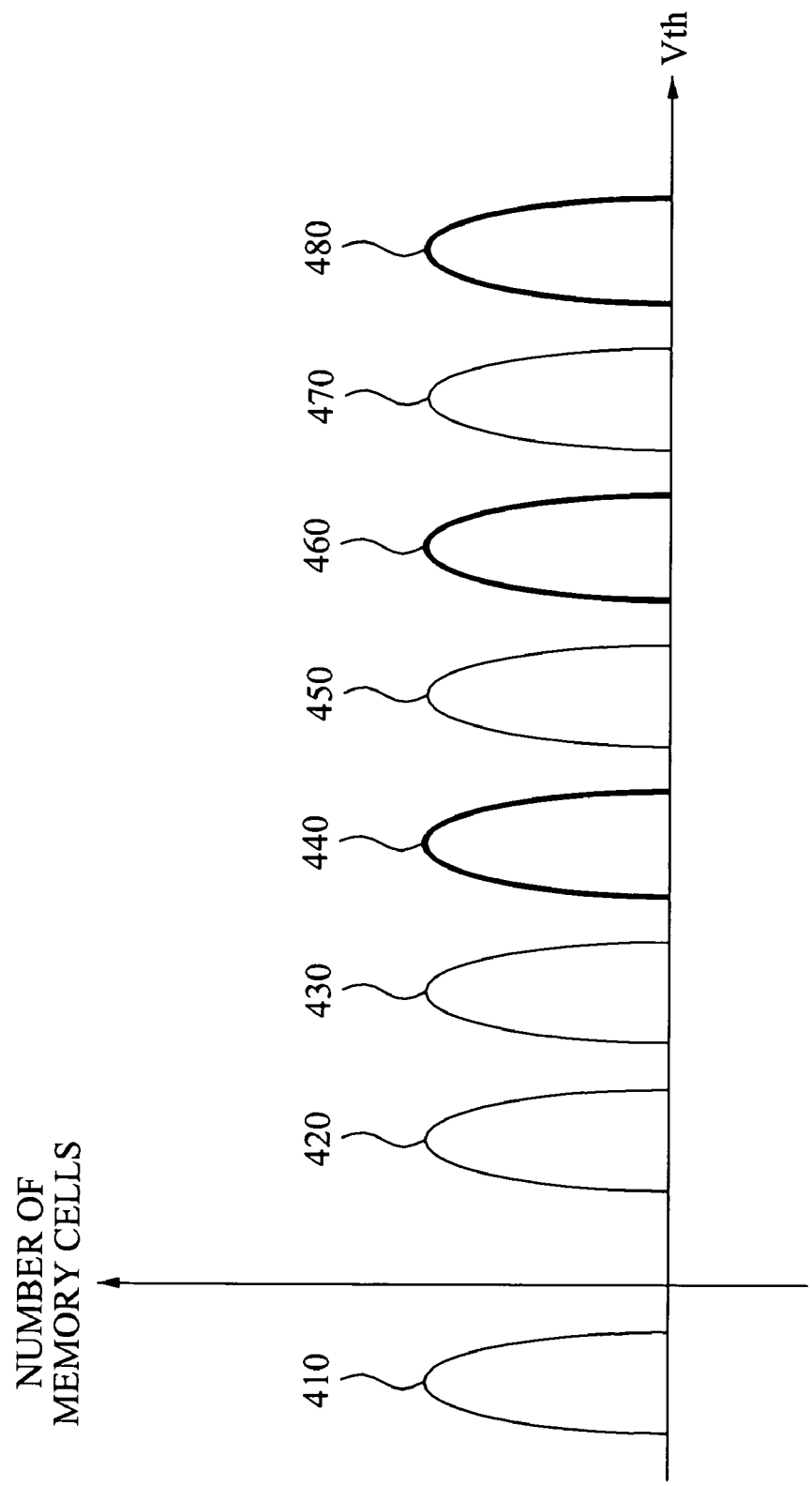
FIG. 4 is a graph illustrating a distribution of a threshold voltage of a data storage unit generated by the memory programming apparatus of FIG. 1.

FIG. 4 is a graph illustrating a distribution of a threshold voltage of a data storage unit 110 formed by the memory programming apparatus 100 of FIG. 1.

Referring to FIG. 4, a horizontal axis corresponds to threshold voltages of memory cells in the data storage unit 110. A vertical axis of FIG. 4 corresponds to a number of memory cells having a threshold voltage.

A distribution state 410 shows a distribution of threshold voltage of erased memory cells or non-programmed memory cells.

Distribution states 420, 430, 440, 450, 460, 470, and 480 show distributions of threshold voltages of memory cells which may be programmed by the programming unit 140 of FIG. 1.

The distributions states 410, 420, 430, 440, 450, 460, 470, and 480 show that a single cell may store up to 3-bit data.

The memory programming apparatus 100 may store a 3-bit data page by mapping each of memory cells in the data storage unit 110 to be any one of the distribution states 410, 420, 430, 440, 450, 460, 470, and 480.

The distribution state 410 may correspond to data "111," and the distribution state 420 may correspond to data "110." The distribution 430 may correspond to data "100," and the distribution state 440 may correspond to data "101." The distribution 450 may correspond to data "001," and the distribution state 460 may correspond to data "000." The distribution 470 may correspond to data "010," and the distribution state 480 may correspond to data "011."

The first counting unit 130 may use threshold voltage states corresponding to the distribution states 440, 460, and 480 as reference threshold voltage states. The reference threshold voltage states may be predetermined, or may be selected by the first counting unit 130 during the course of programming.

The first counting unit 130 may generate first index information according to a number of the data "101" occurring in the 3-bit data page. The first index information may correspond to the distribution state 440.

The first counting unit 130 may generate second index information according to a number of the data "000" occurring in the 3-bit data page. The second index information may correspond to the distribution state 460.

The first counting unit 130 may generate third index information according to a number of the data "011" occurring in the 3-bit data page. The third index information may correspond to the distribution state 480.

The first counting unit 130 according example embodiments may generate the first index information to be index information corresponding to the distribution states 440, 450, 460, 470, and 480, and may generate the first index information based on a number of the data "101," "001," "000," "010," and "011" occurring in the 3-bit data page. The first counting unit 130 may generate the second index information to be index information corresponding to the distribution states 460, 470, and 480, and may generate the second index information based on a number of the data "000," "010," and "011" occurring in the 3-bit data page.

Figure 5:
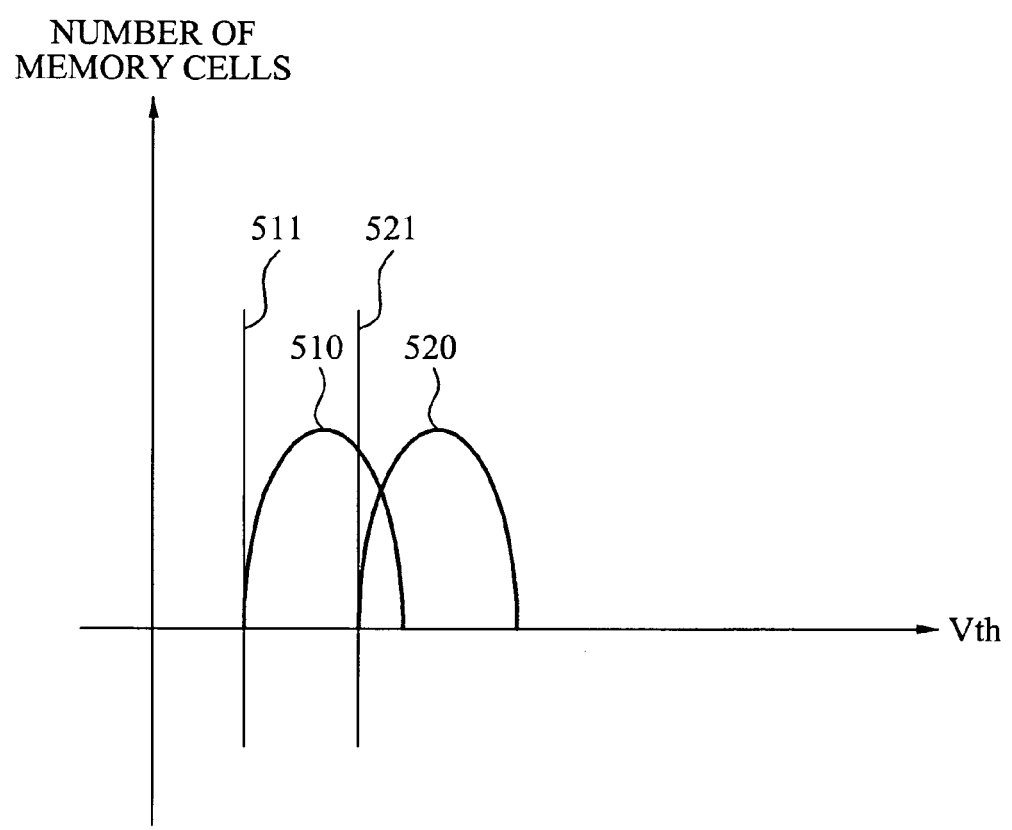
FIG. 5 is a graph illustrating monitoring changes of distributions of threshold voltage by the memory programming apparatus of FIG. 3.

FIG. 5 is a graph illustrating monitoring changes of distributions by the memory programming apparatus 300 of FIG. 3.

Referring to FIG. 5, a horizontal axis corresponds to threshold voltages of memory cells of the data storage unit 310 of FIG. 3. A vertical axis of FIG. 5 corresponds to a number of memory cells having threshold voltages.

A distribution state 520 may show a distribution state of the threshold voltage of memory cells right after the memory cells are programmed.

A distribution state 510 may show a distribution state of threshold voltage of memory cells after the memory cells are programmed and an amount of time passes.

The distribution state 520 may be distinguished from a distribution state of lower threshold voltages by a test read voltage level 521.

The distribution state 510 may be distinguished from a distribution state of lower threshold voltages by a test read voltage level 511.

Generally, after non-volatile memory cells are programmed, threshold voltages of the programmed memory cells may change over time due to a charge loss effect, such as when a floating gate loses its charge.

The threshold voltages of the memory cells right after the memory cells are programmed may follow the distribution state 520. Since the threshold voltages of the programmed memory cells may decrease over time, threshold voltages of some memory cells that previously followed the distribution state 520 may follow the distribution state 510. It is assumed that a number of memory cells following the distribution state 510 may be identical to a number of memory cells following the distribution state 520. In this instance, when the detection unit of FIG. 3 reads the data stored in the memory cells in the data storage unit 310 by using the test read voltage level 521, a portion of a number of memory cells following the distribution state 510 may be detected.

Since the verification information generated by the second counting unit 360 may have a value smaller than the number of the memory cells in the distribution state 510, and the index information stored in the index storage unit 320 may have a value identical to the number of the memory cells in the distribution state 520, the verification information may have a smaller value than the index information.

The threshold voltage monitoring unit 370 may monitor changes of the threshold voltages of the memory cells by sequentially lowering the test read voltage level when the verification information has a smaller value than the index information.

The threshold voltage monitoring unit 370 according to example embodiments may monitor changes of the threshold values of the memory cells by lowering the test read voltage level in proportion to a difference (of the index information subtracted from the verification information) when the verification information has a smaller value than the index information. When the verification information has a smaller value than the index information, a subsequent test read voltage level may equal the following formula: (a present test read voltage level)−(a proportion constant)×(the index information−the verification information). Accordingly, the memory programming apparatus 300 may rapidly find an optimal test read voltage level. The optimal test read voltage level may be a test read voltage which satisfies the condition that the verification information equal the index information.

Figure 6:
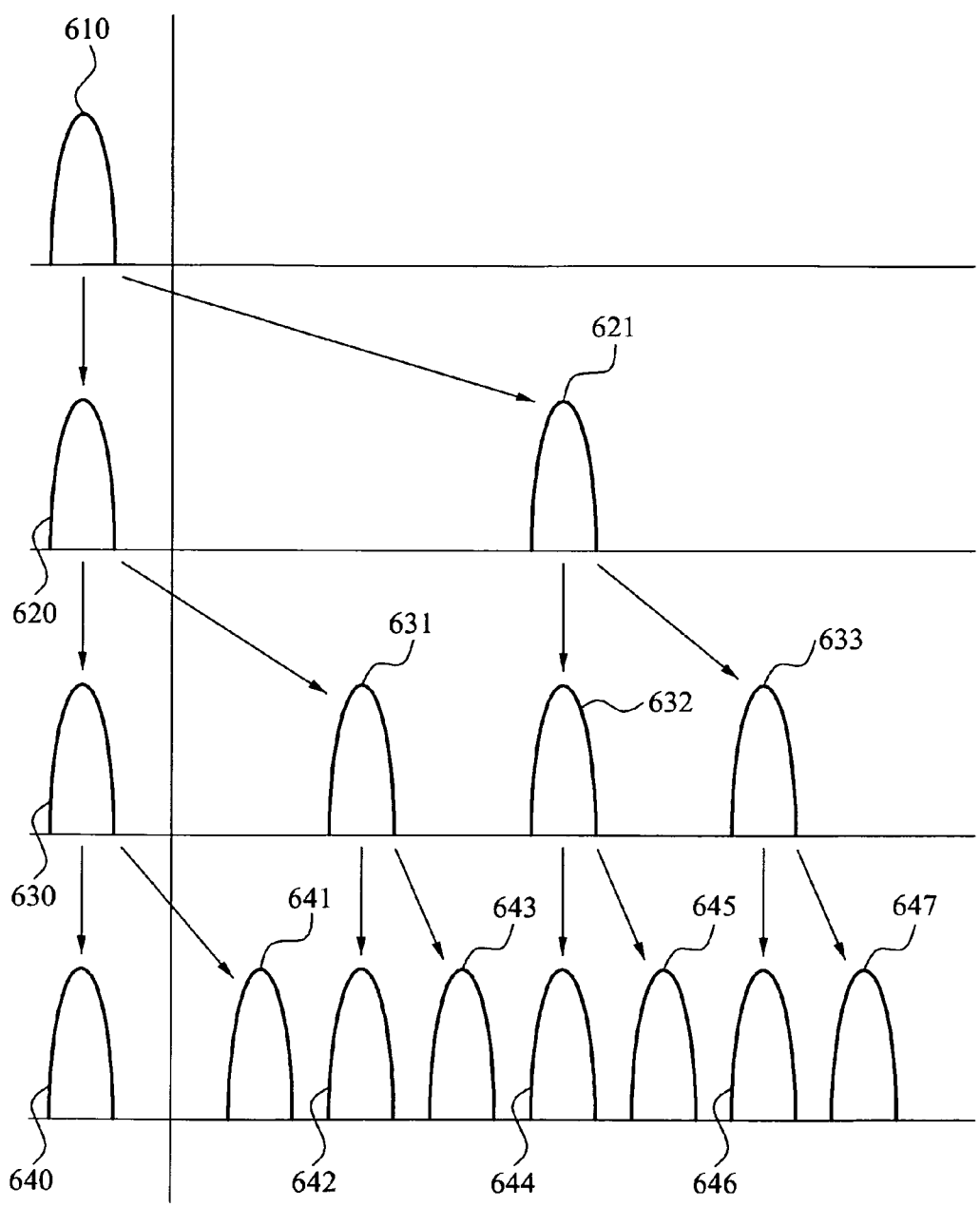
FIG. 6 is a graph illustrating forming distributions of the threshold voltage in the data storage unit by the memory programming apparatus of FIG. 1.

FIG. 6 is a graph illustrating forming distributions of the threshold voltage in the data storage unit by the memory programming apparatus 100 of FIG. 1.

FIG. 6 shows a number of memory cells having a threshold voltage, the memory cells may be included in the data storage unit 110. All cells in the data storage unit 110 may follow a distribution state 610 before the programming unit 140 of FIG. 1 programs a data page. A page programming operation storing 3-bit multi-bit data in the data storage unit 110 is illustrated in FIG. 6.

The programming unit 140 may determine whether to increase threshold voltages of memory cells depending on a most significant bit (MSB) of the data. The programming unit 140 may maintain threshold voltages of memory cells where data "111," "110," "100," and "101" are to be stored. The memory cells where data "111", "110", "100", and "101" are to be stored may form a distribution state 620. The programming unit 140 may increase threshold voltages of memory cells where data "001," "000," "010," and "011" are to be stored. The memory cells where data "001," "000," "010," and "011" are to be stored may form a distribution state 621. These sequences may be referred to as first page programming operations.

During the course of a second page programming operation, the programming unit 140 may determine whether to increase threshold voltages of memory cells according to the MSB and a second bit of the data page. The programming unit 140 may maintain threshold voltages of the memory cells of the distribution state 620 where data "111" and "110" are to be stored or may increase by an insignificantly small value. The memory cells where data "111" and "110" are to be stored may form a distribution state 630. The programming unit 140 may increase threshold voltages of the memory cells of the distribution state 620 where data "100" and "101" are to be stored. The memory cells where data "100" and "101" are to be stored may form a distribution state 631.

The programming unit 140 may maintain threshold voltages of the memory cells of the distribution state 621 where data "001" and "000" are to be stored or may increase by an insignificantly small value. The memory cells where data "001" and "000" are to be stored may form a distribution state 633. The programming unit 140 may increase threshold voltages of the memory cells of the distribution state 621 where data "010" and "011" are to be stored. The memory cells where data "010" and "011" are to be stored may form a distribution state 633. These sequences may be referred to as second page programming operations.

During the course of a third page programming operation, the programming unit 140 may determine whether to increase threshold voltages of memory cells according to the MSB, the second bit, and a least significant bit (LSB) of the data page.

The programming unit 140 may maintain threshold voltages of the memory cells of the distribution state 630 where data "111" is to be stored. The memory cells where data "111" is to be stored may form a distribution state 640.

The programming unit 140 may increase threshold voltages of the memory cells of the distribution state 630 where data "110" is to be stored. The memory cells where data "110" is to be stored may form a distribution state 641.

The programming unit 140 may maintain threshold voltages of the memory cells of the distribution state 631 where data "100" is to be stored or may increase by insignificantly small value. The memory cells stores data "100" may form a distribution state 642.

The programming unit 140 may increase threshold voltages of the memory cells of the distribution state 630 where data "101" is to be stored. The memory cells where data "101" is to be stored may form a distribution state 643.

The programming unit 140 may maintain threshold voltages of the memory cells of the distribution state 632 where data "001" is to be stored or may increase by insignificantly small value. The memory cells where data "001" is to be stored may form a distribution state 644.

The programming unit 140 may increase threshold voltages of the memory cells of the distribution state 632 where data "000" is to be stored. The memory cells where data "000" is to be stored may form a distribution state 645.

The programming unit 140 may maintain threshold voltages of the memory cells of the distribution state 633 where data "010" is to be stored or may increase by insignificantly small value. The memory cells where data "010" is to be stored may form a distribution state 646.

The programming unit 140 may increase threshold voltages of the memory cells of the distribution state 633 where data "110" is to be stored. The memory cells where data "110" is to be stored may form a distribution state 647.

Figure 7:
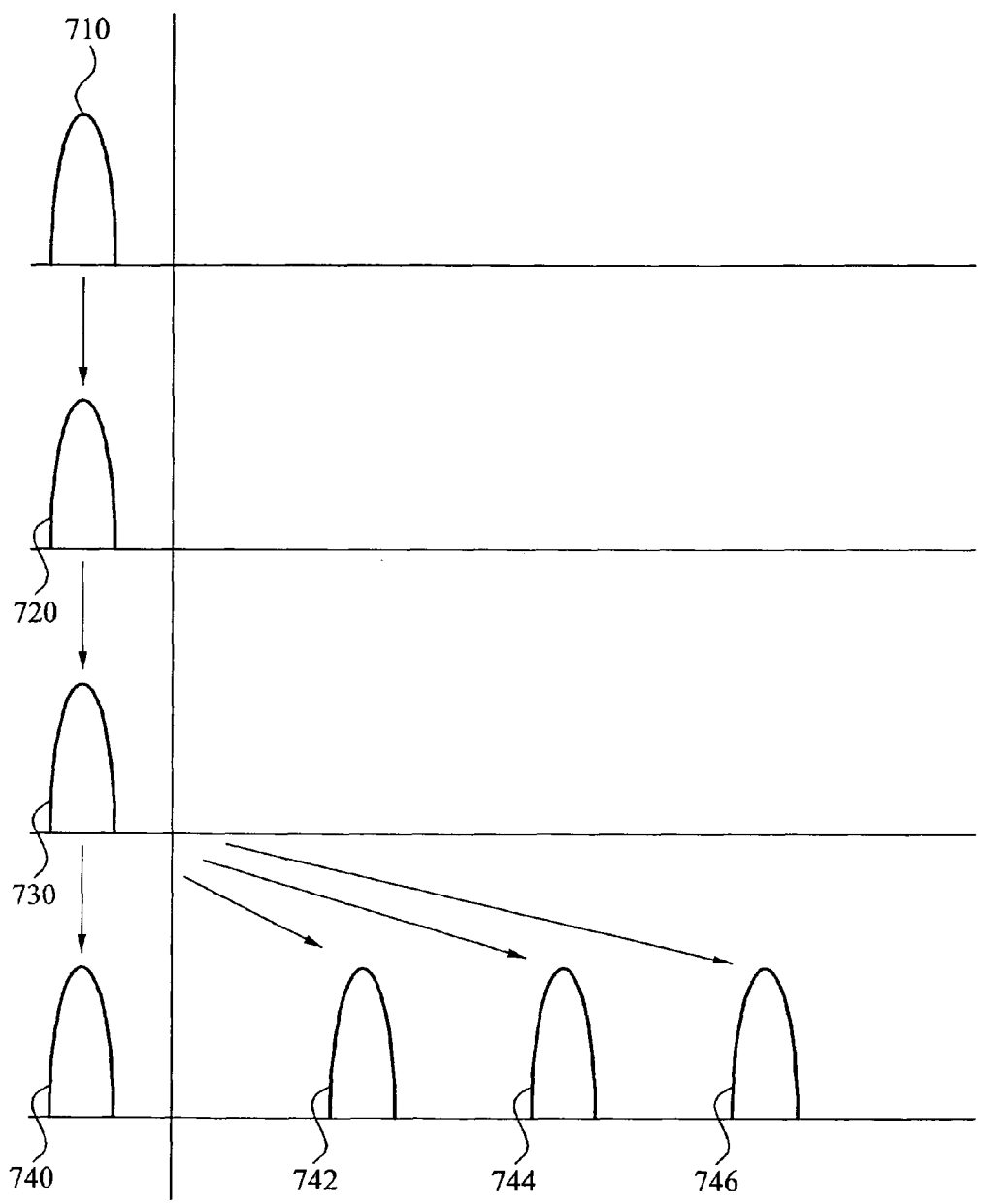
FIG. 7 is a graph illustrating index information programmed in an index storage unit by the memory programming apparatus of FIG. 1.

FIG. 7 is a graph illustrating programming index information in the index storage unit 120 of FIG. 1 by the memory programming apparatus 100 of FIG. 1. FIG. 7 shows a number of memory cells having a threshold voltage, the memory cells may be included in the index storage unit 120. The programming unit 140 may store the index information in the index storage unit 120 with 2-bit data density.

The programming unit 140 may increase reliability of the stored index information by storing the index information in a memory cell with 2-bit data density, since the memory cell may store the index information with 3-bit data density.

The programming unit 140 may not store the index information in the index storage unit 120 during the course of the first page programming operation and the second page operation with respect to the data storage unit 110. In this instance, before and after the first page programming operation, the threshold voltages of the memory cells may be mapped from a distribution state 710 to a distribution state 720, and may not be substantially changed. Similarly, before and after the second page programming operation, the threshold voltages of the memory cells may be mapped from a distribution state 720 to a distribution state 730.

The programming unit 140 may store index information in the index storage unit 120 during the course of the third page programming operation. When index information is "11," a threshold voltage of a memory cell may be mapped to a distribution state 740 during the course of the third page programming operation. In this instance, the threshold voltage may not be substantially changed.

When index information to be stored in a memory cell is "10," a threshold voltage of the memory cell may transit to a distribution state 742 during the third page programming operation. When index information to be stored in a memory cell is "00," a threshold voltage of the memory cell may transit to a distribution state 744, and when index information is to be stored in the memory cell is "01," a threshold voltage of the memory cell may transit to a distribution state 746.

The programming unit 140 may use a programming scheme identical to the data page programming operation when storing the index information, without an additional programming operation.

When a memory page of the data storage unit 110, which is simultaneously programmed via the page programming operation, is for example 4 Kilobytes, a storage space required to store index information for a single distribution state may be 15 bits. When a single memory cell in the index storage unit 120 stores index information with 2-bit data density, eight memory cells per a single distribution state may be required to store the index information.

Figure 8:
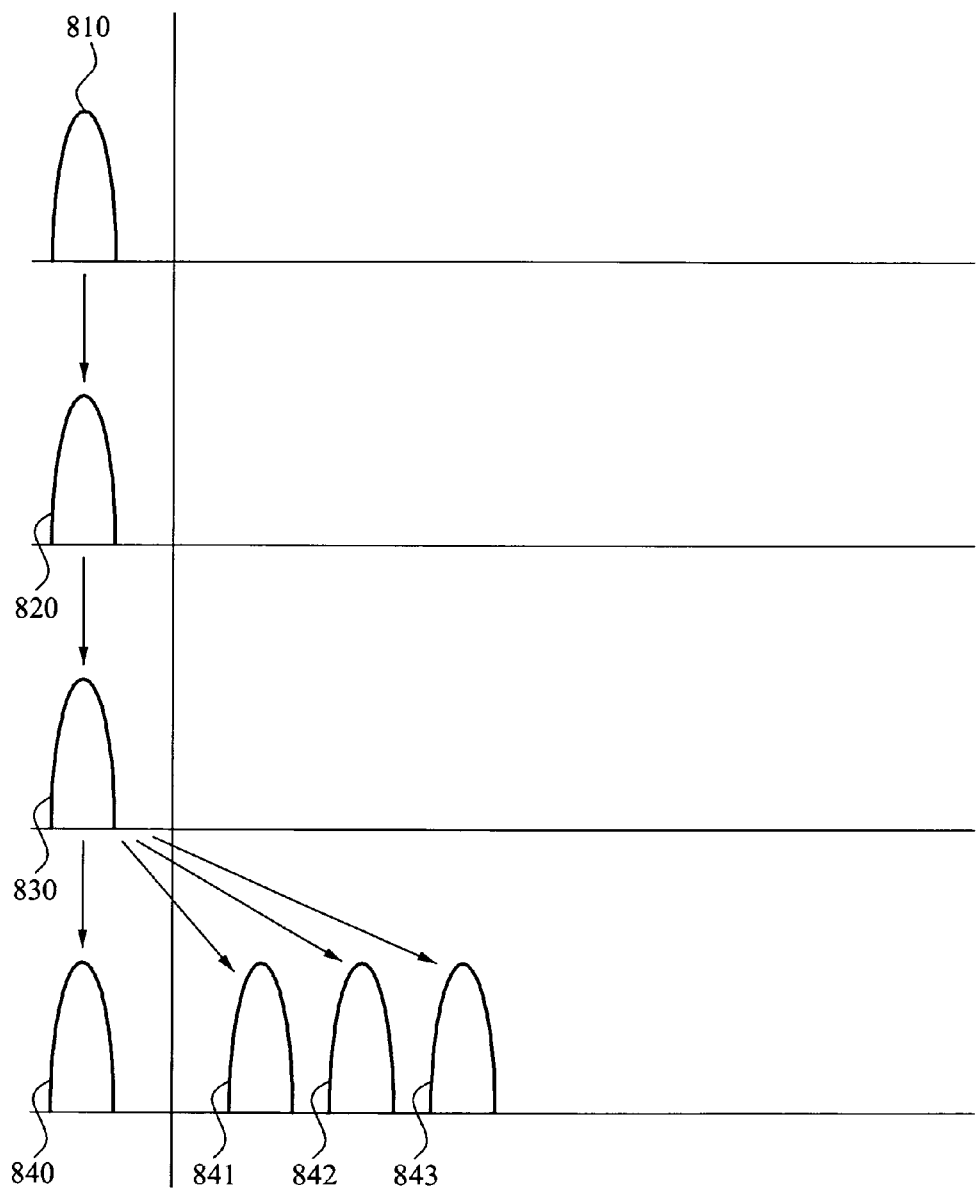
FIG. 8 is a graph illustrating another index information programmed in an index storage unit by the memory programming apparatus of FIG. 1.

FIG. 8 is another graph illustrating programming index information in the index storage unit 120 of FIG. 1 by the memory programming apparatus 100 of FIG. 1. FIG. 8 shows a number of memory cells having a threshold voltage, the memory cells may be included in the index storage unit 120. The programming unit 140 may store the index information in the index storage unit 120 with 2-bit data density.

The programming unit 140 may increase reliability of the stored index information by storing the index information in a memory cell with 2-bit data density, since the memory cell may store the index information with 3-bit data density The programming unit 140 may not store the index information in the index storage unit 120 during the first page programming operation and the second page programming operation with respect to the data storage unit 110. In this instance, before and after the first page programming operation, the threshold voltages of the memory cells may be mapped from a distribution state 810 to a distribution state 820, and, before and after the second page programming operation, the threshold voltages of the memory cells may be mapped from the distribution state 820 to a distribution state 830.

The programming unit 140 may store index information in the index storage unit 120 during the course of the third page programming operation. When index information to be stored in a memory cell is "11," a threshold voltage of a memory cell may be mapped to a distribution state 840 during the third page programming operation. In this instance, the threshold voltage may be not substantially changed.

When index information to be stored in the index storage unit is "10," a threshold voltage of a memory cell may transit to a distribution state 841 during the third page programming operation. When index information to be stored in the index storage unit is "00," a threshold voltage of a memory cell may transit to a distribution state 842, and when index information to be stored in the index storage unit is "01," a threshold voltage of a memory cell may transit to a distribution state 843.

The programming unit 140 may reduce changes of threshold voltages of memory cells of the index storage unit 120 during the course of the third page programming operation. Through this, memory cells in the index storage unit 120 and the data storage unit 110 may reduce undesired changes of threshold voltages occurring due to a mechanism of floating poly-silicon (FP) coupling. The FP coupling is a phenomenon that a threshold voltage of a central memory cell is changed due to a rapid change of threshold voltages of adjacent memory cells.

Figure 9:
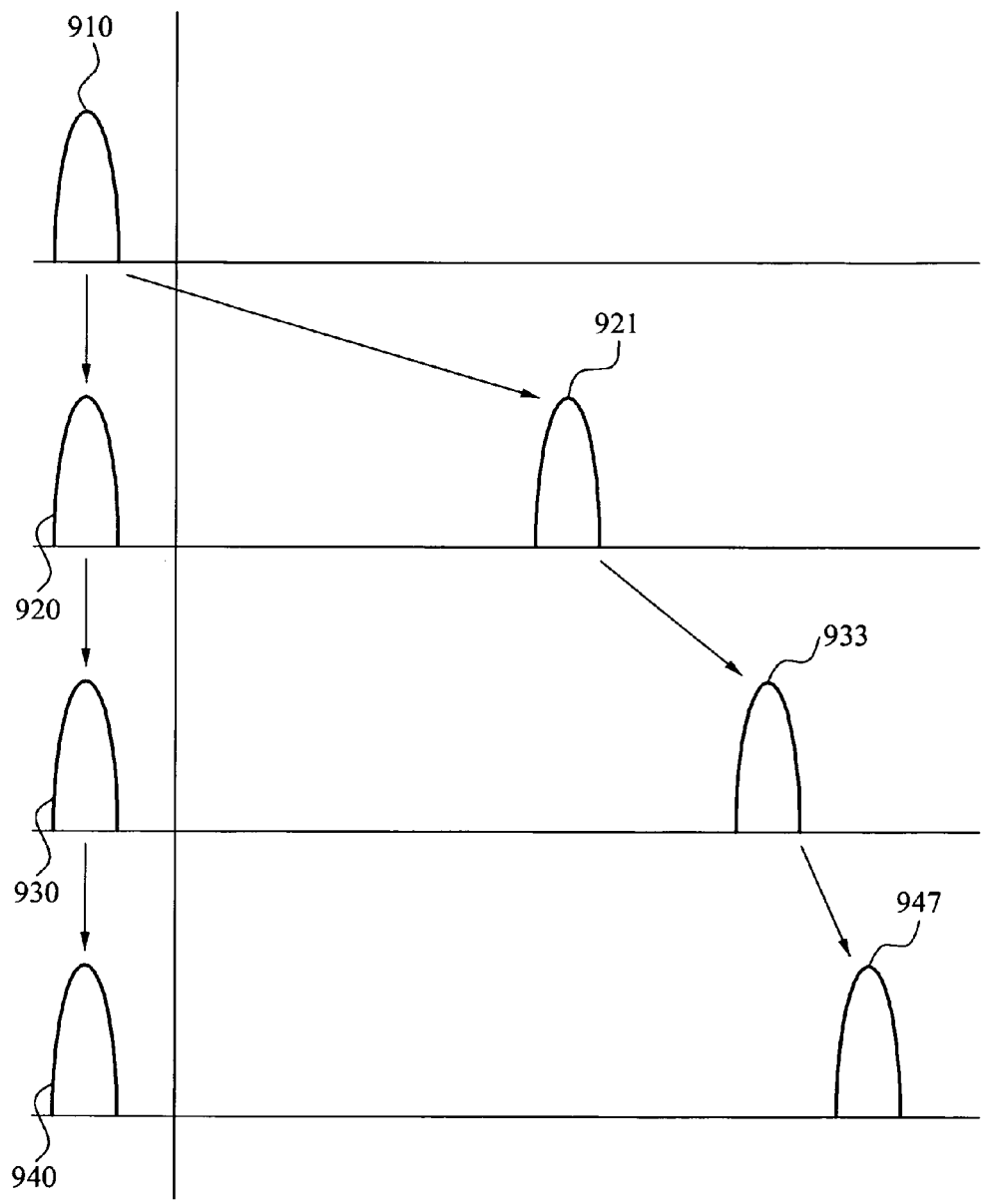
FIG. 9 is a graph illustrating still another index information programmed in an index storage unit by the memory programming apparatus of FIG. 1.

FIG. 9 is a still another graph illustrating programming index information in the index storage unit 120 of FIG. 1 by the memory programming apparatus 100 of FIG. 1. FIG. 9 shows a number of memory cells having a threshold voltage, the memory cells may be included in the index storage unit 120. The programming unit 140 may store the index information in the index storage unit 120 with 2-bit data density.

The programming unit 140 may increase reliability of the stored index information by storing the index information in a memory cell with 2-bit data density, since the memory cell can store the index information with 3-bit data density The programming unit 140 may sequentially store the index information in the index storage unit 120 over the course of the three page programming operations.

When index information to be stored in a memory cell of the index storage unit 120 is "11," a threshold voltage of the memory cell after programming may correspond to a distribution state 940. When index information to be stored in a memory cell of the index storage unit 120 is "10," a threshold voltage of the memory cell after programming may correspond to a distribution state 921. When index information to be stored in a memory cell of the index storage unit 120 is "00," a threshold voltage of the memory cell after programming may correspond to a distribution state 933. When index information to be stored in a memory cell of the index storage unit 120 is "01," a threshold voltage of the memory cell after programming may correspond to a distribution state 947.

The programming unit 140 may maintain threshold voltage of a memory cell storing the index information "11" during the first page programming operation. The memory cell storing the index information "11" may form a distribution state

920. The programming unit 140 may increase threshold voltages of memory cells storing the index information "10," "00," and "01" during the first page programming operation. The memory cells storing the index information "10," "00" and "01" may form a distribution state 921 after the first page programming operation.

The programming unit 140 may increase threshold voltages of memory cells storing the index information "00" and "01" during the second page programming operation. The memory cells storing the index information "00" and "01" may form a distribution state 933 after the second page programming operation. In this instance, the memory cell storing the index information "11" may form the distribution state 930, and the memory cell storing the index information "10" may form the distribution state 921.

The programming unit 140 may increase a threshold voltage of a memory cell storing the index information "01" during the third page programming operation. The memory cell storing the index information "01" may form a distribution state 947 after the third page programming operation. In this instance, the memory cell storing the index information "11" may form a distribution state 940, the memory cell storing the index information "10" may form the distribution state 921, and the memory cell storing the index information "00" may form the distribution state 933.

The programming unit 140 may reduce undesired changes of threshold voltages occurring due to the FP coupling by sequentially performing the programming operations with respect to the index storage unit 120.

Figure 10:
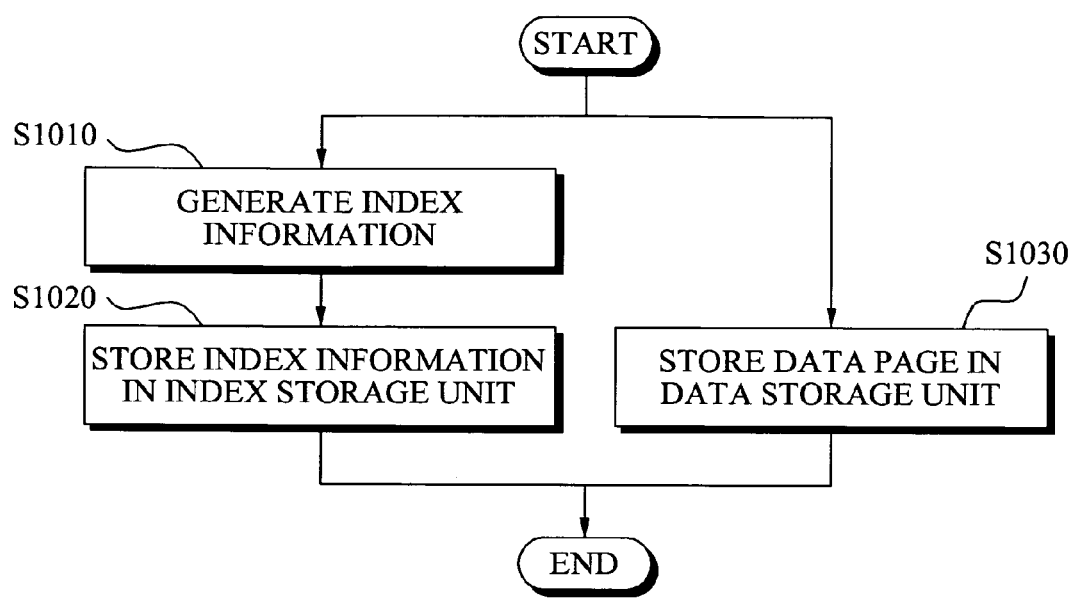
FIG. 10 is a flowchart illustrating a memory programming method according to example embodiments.

FIG. 10 is a flowchart illustrating a memory programming method according to example embodiments.

Referring to FIG. 10, the memory programming method may generate index information by counting a number of the at least one reference threshold voltage state based on a data page to be stored in the data storage unit 110 of FIG. 1 in operation S1010.

The memory programming method may store a data page in the data storage unit 110 of FIG. 1 in operation S1030.

The memory programming method may store index information in the index storage unit 120 of FIG. 1 in operation S1020.

Operation S1020 may be performed simultaneously with operation S1030.

The data storage unit 110 and the index storage unit 120 may include a multi-bit cell. A multi-bit cell may store multi-bit data greater than 1 bit.

The memory programming method may read the stored data pages. The memory programming method may generate verification information by counting a number of the at least one reference threshold voltages state based on the read data pages. The memory programming method may determine whether an error occurs on the read data pages based on the generated verification information and the index information stored in the index storage unit 120.

The memory programming method may monitor a distribution of a threshold voltage of cells in the data storage unit 110 based on the generated verification information and the index information stored in the index storage unit 120.

The memory programming method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

The foregoing descriptions of example embodiments have been presented for purposes of illustration and description. They are not intended to be exhaustive or to limit example embodiments to the precise forms disclosed, and obviously many modifications and variations are possible in light of the above teaching. Therefore, it is intended that the scope of example embodiments be defined by the claims appended thereto and their equivalents.

While example embodiments have been particularly shown and described, it will be understood by those of ordinary skill in the art that various changes in form and details may be made therein without departing from the spirit and scope of example embodiments as defined by the following claims.

What is claimed is:

1. A multi-bit programming apparatus that programs a memory, the apparatus comprising:
a data storage unit configured to store a plurality of data pages;
a first counting unit configured to generate index information by counting a number of cells included in at least one reference threshold voltage state based on the plurality of data pages;
an index storage unit configured to store the generated index information; and
a programming unit configured to store the plurality of data pages in the data storage unit by performing a plurality of page programming operations and store the generated index information in the index storage unit while a last page programming operation of the plurality of page programming operations is performed, wherein the first counting unit sends the generated index information to the programming unit.

2. The apparatus of claim 1, further comprising:
a detection unit configured to read the data page stored in the data storage unit;
a second counting unit configured to generate verification information by counting a number of the at least one reference threshold voltage states based on the read data page; and
an error determination unit configured to determine whether an error occurs on the read data page based on the generated verification information and the index information stored in the index storage unit.

3. The apparatus of claim 1, further comprising:
a detection unit configured to read the data page stored in the data storage unit;
a second counting unit configured to generate verification information by counting a number of the at least one reference threshold voltage states based on the read data page; and
a threshold voltage monitoring unit configured to monitor changes of distributions of threshold voltages of cells in the data storage unit based on the generated verification information and the index information stored in the index storage unit.

4. The apparatus of claim 1, wherein the programming unit stores the generated index information in the index storage unit while the data page is stored in the data storage unit.

5. The apparatus of claim 1, wherein the data storage unit and index storage unit include at least one multi-bit cell in which multi-bit data is stored.

6. The apparatus of claim 5, wherein the programming unit stores a plurality of the data pages in the data storage unit at a first density and stores the generated index information in the index storage unit at a second density, where the first density is greater than the second density.

7. The apparatus of claim 5, wherein the programming unit stores the plurality of data pages by performing the plurality of page programming operations and sequentially stores the generated index information in the index storage unit while each of the plurality of page programming operations is performed.

8. The apparatus of claim 5, wherein the programming unit stores the data page in the data storage unit using a first verification voltage set and stores the index information in the index storage unit using a second verification voltage set.

9. The apparatus of claim 1, wherein the programming unit is further configured to erase the data storage unit and the index storage unit, with the programming unit pre-programming a cell which is not programmed from among the data storage unit and the index storage unit before the data storage unit and the index storage unit are erased.

10. The apparatus of claim 1, wherein the programming unit is further configured to select the at least one reference threshold voltage state from among the plurality of threshold voltage states.

11. The apparatus of claim 1, wherein the index information is generated with respect to each of the at least one threshold voltage states, and each of the generated index information is generated by counting a number of cells having a threshold voltage higher than the corresponding reference threshold voltage state.

12. The apparatus of claim 3, wherein,
the index storage unit is connected to a word line to which the data storage unit is connected;
the programming unit multi-bit programs the data page in the data storage unit by applying a plurality of first voltage levels to the word line, and single-bit programs the generated index information in the index storage unit by applying a second voltage level to the word line; and
the second voltage level is selected to correspond to a first page programming operation of the multi-bit programming, from among the plurality of first voltage levels.

13. A multi-bit programming method that programs a memory, the method comprising:
generating index information by counting a number of cells included in each of at least one reference threshold voltage states based on a plurality of data pages;
storing the plurality of data pages by performing a plurality of page programming operations; and
storing the generated index information while a last page programming operation of the plurality of page programming operations is performed.

14. The method of claim 13, further comprising:
reading the stored data page;
generating verification information by counting a number of the at least one reference threshold voltage state based on the read data page; and
determining whether an error occurs in the read data page based on the generated verification information and the stored index information.

15. The method of claim 13, further comprising:
reading the stored data page;
generating verification information by counting a number of the at least one reference threshold voltage states based on the read data page; and
monitoring changes of distributions of threshold voltages of cells storing the read data pages based on the generated verification information and the stored index information.

16. The method of claim 13, wherein the storing of the generated index information is performed while the storing of the data page.

17. The method of claim 13, wherein the storing of the generated index information and the storing of the data page data includes storing multi-bit data.

18. A computer-readable medium storing a computer program for implementing the method of claim 13.

* * * * *